United States Patent
Watanabe

(10) Patent No.: US 10,177,228 B2
(45) Date of Patent: Jan. 8, 2019

(54) SEMICONDUCTOR DEVICE AND METHOD FOR MANUFACTURING SEMICONDUCTOR DEVICE

(71) Applicant: Mitsubishi Electric Corporation, Chiyoda-ku (JP)

(72) Inventor: Hiroshi Watanabe, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/540,410

(22) PCT Filed: Aug. 5, 2015

(86) PCT No.: PCT/JP2015/072196
§ 371 (c)(1),
(2) Date: Jun. 28, 2017

(87) PCT Pub. No.: WO2016/113938
PCT Pub. Date: Jul. 21, 2016

(65) Prior Publication Data
US 2017/0373152 A1 Dec. 28, 2017

(30) Foreign Application Priority Data
Jan. 14, 2015 (JP) .................................. 2015-004882

(51) Int. Cl.
*H01L 29/10* (2006.01)
*H01L 29/739* (2006.01)
(Continued)

(52) U.S. Cl.
CPC .... *H01L 29/1095* (2013.01); *H01L 21/02529* (2013.01); *H01L 21/046* (2013.01);
(Continued)

(58) Field of Classification Search
CPC ............... H01L 29/1095; H01L 21/046; H01L 29/7395; H01L 29/732; H01L 21/02529;
(Continued)

(56) References Cited

U.S. PATENT DOCUMENTS 5,721,437 A * 2/1998 Twynam ............. H01L 29/0817
257/197
5,831,287 A 11/1998 Bakowski et al.
(Continued)

FOREIGN PATENT DOCUMENTS

JP 6-349847 A 12/1994
JP 10-321857 A 12/1998
(Continued)

OTHER PUBLICATIONS

Office Action dated Jun. 14, 2016 in Japanese Patent Application No. 2016-509166 (with partial English translation).
(Continued)

*Primary Examiner* — Yasser A Abdelaziez
(74) *Attorney, Agent, or Firm* — Oblon, McClelland, Maier & Neustadt, L.L.P.

(57) ABSTRACT

The present techniques relate to a semiconductor device having resistance which has a positive temperature coefficient and a suitable value, and to a method for manufacturing a semiconductor device having resistance which has a positive temperature coefficient and a suitable value. The semiconductor device related to the present techniques is a bipolar device in which a current flows through a pn junction. The semiconductor device includes an n-type silicon carbide drift layer, a p-type first silicon carbide layer formed on the silicon carbide drift layer, and a p-type second silicon carbide layer formed on the first silicon carbide layer. Then, the second silicon carbide layer has a positive temperature coefficient of resistance.

5 Claims, 13 Drawing Sheets

(51) Int. Cl.
*H01L 29/861* (2006.01)
*H01L 29/12* (2006.01)
*H01L 29/36* (2006.01)
*H01L 29/66* (2006.01)
*H01L 29/06* (2006.01)
*H01L 29/16* (2006.01)
*H01L 21/02* (2006.01)
*H01L 21/04* (2006.01)
*H01L 29/732* (2006.01)

(52) U.S. Cl.
CPC ...... *H01L 29/0615* (2013.01); *H01L 29/0619* (2013.01); *H01L 29/0657* (2013.01); *H01L 29/0688* (2013.01); *H01L 29/12* (2013.01); *H01L 29/1608* (2013.01); *H01L 29/36* (2013.01); *H01L 29/6606* (2013.01); *H01L 29/66068* (2013.01); *H01L 29/732* (2013.01); *H01L 29/739* (2013.01); *H01L 29/7395* (2013.01); *H01L 29/861* (2013.01)

(58) Field of Classification Search
CPC ........... H01L 29/66068; H01L 29/0615; H01L 29/0688; H01L 29/36; H01L 29/1608; H01L 29/0619; H01L 29/6606; H01L 29/0657; H01L 29/739; H01L 29/12; H01L 29/861
See application file for complete search history.

(56) References Cited

U.S. PATENT DOCUMENTS

| | | | |
|---|---|---|---|
| 6,246,092 | B1 | 6/2001 | Fujihira et al. |
| 6,548,865 | B2 | 4/2003 | Fujihira et al. |
| 8,354,690 | B2 * | 1/2013 | Callanan ............ H01L 29/7455 257/121 |
| 8,648,447 | B2 | 2/2014 | Mizukami et al. |
| 9,270,193 | B2 | 2/2016 | Tanaka et al. |
| 2015/0115285 | A1 * | 4/2015 | Kinoshita ............ H01L 29/872 257/77 |
| 2015/0380503 | A1 * | 12/2015 | Nakano ................ H01L 29/407 257/77 |

FOREIGN PATENT DOCUMENTS

| | | |
|---|---|---|
| JP | 2000-516402 A | 12/2000 |
| JP | 2012-199522 A | 10/2012 |
| WO | WO 98/08259 A1 | 2/1998 |
| WO | WO 2011/111175 A1 | 9/2011 |

OTHER PUBLICATIONS

International Preliminary Report on Patentability and Written Opinion dated Jul. 27, 2017 in PCT/JP2015/072196 (with English translation).
International Search Report dated Nov. 2, 2015, in PCT/JP2015/072196 filed Aug. 5, 2015.

* cited by examiner

F I G. 6
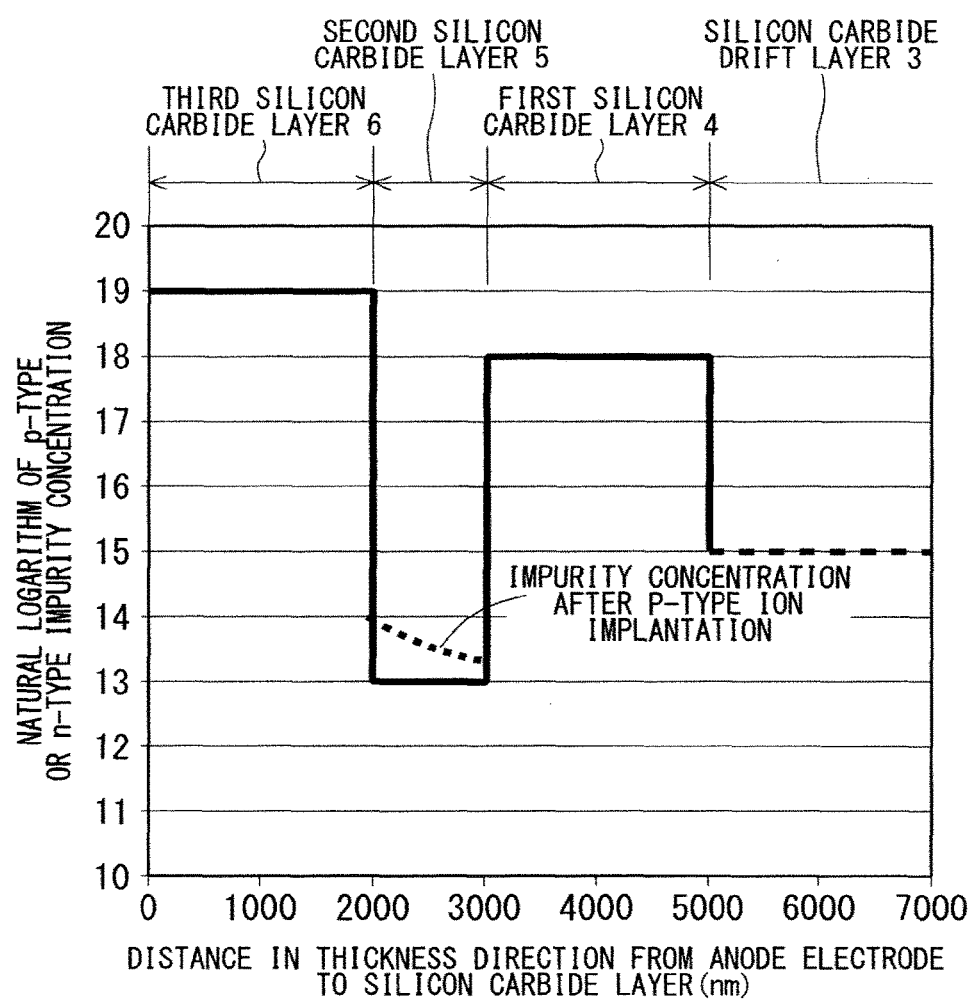

SEMICONDUCTOR DEVICE AND METHOD FOR MANUFACTURING SEMICONDUCTOR DEVICE

TECHNICAL FIELD

The present techniques relate to a semiconductor device which is a bipolar device including a semiconductor layer formed of silicon carbide (SiC), and to a method for manufacturing such a semiconductor device.

BACKGROUND ART

In a conventional bipolar device including a semiconductor layer formed of silicon carbide (SiC), a temperature coefficient of resistance provided when a current flows through a pn junction in a forward direction is negative. In a case where many devices are connected in parallel and are caused to operate, variation in voltage drop among the devices causes a current to concentrate on a device in which relatively great voltage drop occurs. Then, as for devices each having a negative temperature coefficient of resistance at a forward-current-carrying time, in a device on which a current concentrates, resistance is reduced due to temperature rise, so that a current further concentrates thereon. As a consequence, the device is broken down in some cases.

On the other hand, also with regard to a device having a positive temperature coefficient of resistance, in a case where many devices are connected in parallel and are caused to operate, variation in voltage drop among the devices causes a current to concentrate on a device in which relatively great voltage drop occurs. However, when resistance is increased due to temperature rise in the device on which a current concentrates, current concentration is alleviated. As a consequence, a stable operation can be expected in a case where many devices are connected in parallel and are caused to operate.

In view of the above-described matters, as a technique for preventing a current from concentrating on a part of devices in a case where many bipolar devices are connected in parallel and are caused to operate, a configuration in which a resistor having a positive temperature coefficient of resistance is connected in series with a bipolar device is disclosed (Patent Document 1, for example). According to Patent Document 1, an n-type substrate layer which is doped at a low concentration is placed as an epitaxial layer of a device. As a result of providing such a configuration, resistance of the substrate layer contributes to voltage drop of the device as a whole, so that a temperature coefficient of resistance provided when a current flows in a forward direction is positive.

PRIOR ART DOCUMENT

Patent Document

Patent Document 1: Japanese Unexamined Patent Application Laid-Open No. 2000-516402

SUMMARY OF INVENTION

Problems to be Solved by the Invention

The epitaxial layer used in a rectifier semiconductor, which is disclosed in Patent Document 1, includes an n-type layer which is doped at a high concentration in order to form an ohmic contact with a cathode electrode, an n-type substrate layer which is formed on the n-type layer and is doped at a low concentration, an n-type layer which is formed on the substrate layer and is doped at a high concentration, an n-type drift layer which is formed on the n-type layer and is doped at an extremely low concentration, and a p-type layer which is doped at a high concentration in order to form an ohmic contact with an anode electrode formed in a surface layer of the drift layer. In a case where the above-described n-type substrate layer which is doped at a low concentration is used as a resistor having a positive temperature coefficient, variation in doping concentration or film thickness among n-type substrate layers during manufacture results in variation in a desired resistance value. As a result of this, there arises a problematic situation where a resistor having a positive temperature coefficient cannot exert its effect of alleviating current concentration in some cases.

Also, since the drift layer is formed after film formation for the n-type semiconductor layer, there arises another problematic situation where a resistor which has a resistance value set suitably in accordance with variation in doping concentration or film thickness of the drift layer having been formed, and has a positive temperature coefficient, cannot be formed.

The present techniques solve the above-described problems, and relate to a semiconductor device having resistance which has a positive temperature coefficient and has a suitable value, and to a method for manufacturing such a semiconductor device.

Means for Solving the Problems

A semiconductor device related to one aspect of the present techniques is a bipolar device in which a current flows through a pn junction, and includes: a silicon carbide drift layer of a first conductivity type; a first silicon carbide layer of a second conductivity type which is formed on the silicon carbide drift layer; and a second silicon carbide layer of the second conductivity type which is formed on the first silicon carbide layer, in which the second silicon carbide layer has a positive temperature coefficient of resistance.

A method for manufacturing a semiconductor device related to one aspect of the present techniques is a method for manufacturing a bipolar device in which a current flows through a pn junction, and includes the steps of: forming a silicon carbide drift layer of a first conductivity type; forming a silicon carbide layer of a second conductivity type on the silicon carbide drift layer; and further implanting an ion of the second conductivity type into the silicon carbide layer, to form a layer in a portion of the silicon carbide layer which is located on a region closer to the silicon carbide drift layer, and a layer in a portion of the silicon carbide layer which is located on a region opposite to the silicon carbide drift layer, as a first silicon carbide layer and a second silicon carbide layer, respectively, in which the second silicon carbide layer has a positive temperature coefficient of resistance.

A method for manufacturing a semiconductor device related to another aspect of the present techniques is a method for manufacturing a bipolar device in which a current flows through a pn junction, and includes the steps of: forming a silicon carbide drift layer of a first conductivity type; forming a silicon carbide layer of a second conductivity type on the silicon carbide drift layer; and further implanting an ion of the first conductivity type into the silicon carbide layer, to form a layer in a portion of the silicon carbide layer which is located on a region closer to the silicon carbide drift layer, and a layer in a portion of the silicon carbide layer which is located on a region opposite to the silicon carbide drift layer, as a first silicon carbide layer and a second silicon carbide layer, respectively, in which the second silicon carbide layer has a positive temperature coefficient of resistance.

Effects of the Invention

The semiconductor device related to one aspect of the present techniques is a bipolar device in which a current flows through a pn junction, and includes a silicon carbide drift layer of a first conductivity type, a first silicon carbide layer of a second conductivity type which is formed on the silicon carbide drift layer, and a second silicon carbide layer of the second conductivity type which is formed on the first silicon carbide layer, in which the second silicon carbide layer has a positive temperature coefficient of resistance.

With this configuration, since the second silicon carbide layer is formed after the silicon carbide drift layer is formed, a resistance value of the second silicon carbide layer can be adjusted in accordance with the formed silicon carbide drift layer.

A method for manufacturing a semiconductor device according to one aspect of the present techniques is a method for manufacturing a bipolar device in which a current flows through a pn junction, and includes the steps of: forming a silicon carbide drift layer of a first conductivity type; forming a silicon carbide layer of a second conductivity type on the silicon carbide drift layer; and further implanting an ion of the second conductivity type into the silicon carbide layer, to form a layer in a portion of the silicon carbide layer which is located on a region closer to the silicon carbide drift layer, and a layer in a portion of the silicon carbide layer which is located on a region opposite to the silicon carbide drift layer, as a first silicon carbide layer and a second silicon carbide layer, respectively, in which the second silicon carbide layer has a positive temperature coefficient of resistance.

With this configuration, since the second silicon carbide layer can be formed by implantation of an ion of the second conductivity type, an impurity concentration of the second silicon carbide layer can be adjusted suitably in accordance with a desired resistance value.

A method for manufacturing a semiconductor device according to another aspect of the present techniques is a method for manufacturing a bipolar device in which a current flows through a pn junction, and includes the steps of: forming a silicon carbide drift layer of a first conductivity type; forming a silicon carbide layer of a second conductivity type on the silicon carbide drift layer; and further implanting an ion of the first conductivity type into the silicon carbide layer, to form a layer in a portion of the silicon carbide layer which is located on a region closer to the silicon carbide drift layer, and a layer in a portion of the silicon carbide layer which is located on a region opposite to the silicon carbide drift layer, as a first silicon carbide layer and a second silicon carbide layer, respectively, in which the second silicon carbide layer has a positive temperature coefficient of resistance.

With this configuration, since the second silicon carbide layer can be formed by implantation of an ion of the first conductivity type, an impurity concentration of the second silicon carbide layer can be adjusted suitably in accordance with a desired resistance value.

An object, features, aspects, and advantages of the present techniques will become more apparent from the following detailed description and the accompanying drawings.

BRIEF DESCRIPTION OF DRAWINGS

FIG. 6 is a view showing a profile of p-type and n-type impurity concentrations of silicon carbide layers arranged in a thickness direction from an anode electrode in the semiconductor device related to the embodiments.

DESCRIPTION OF EMBODIMENTS

Figure 1:
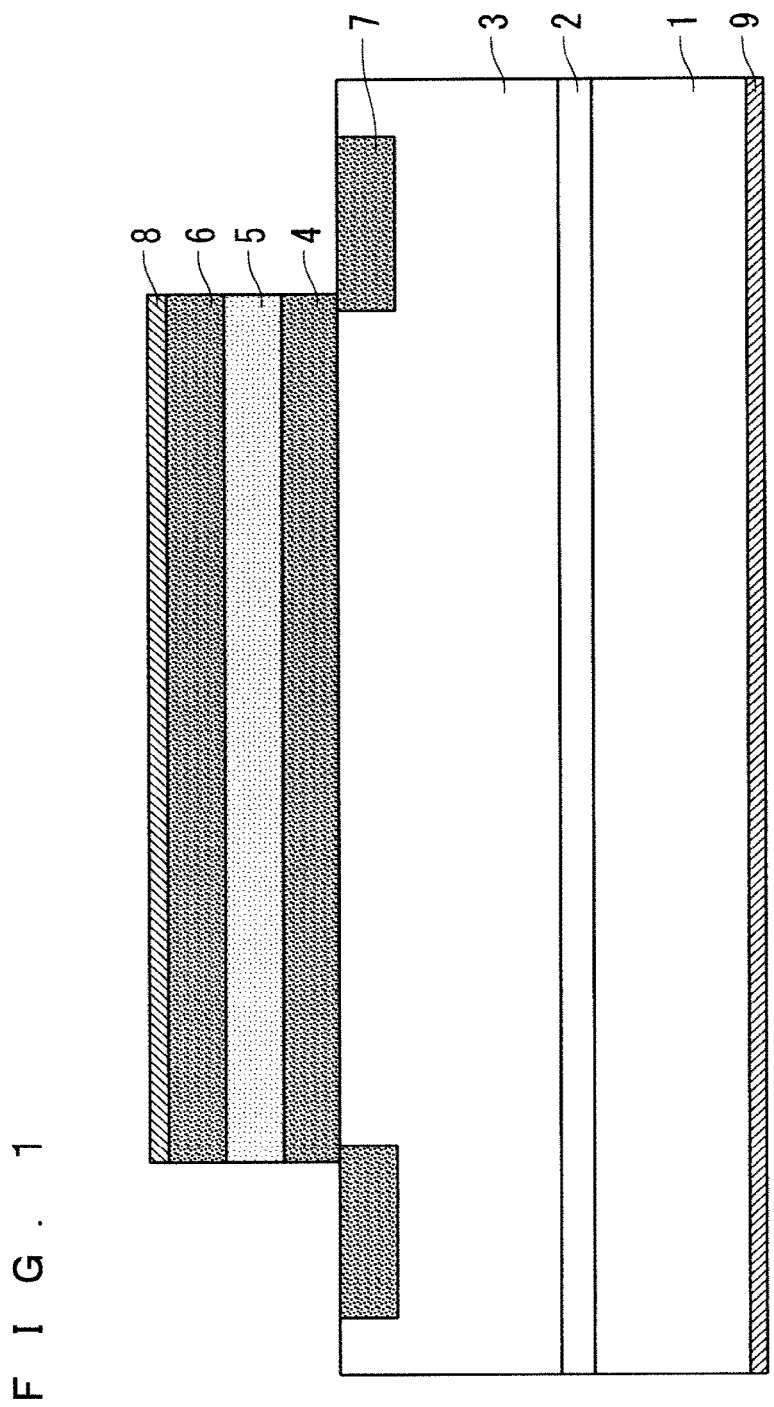
FIG. 1 is a cross-sectional view showing a configuration of a semiconductor device related to embodiments.

Hereinafter, embodiments will be described with reference to the accompanying drawings. It is noted that the drawings provide schematic representations, and respective sizes and positional interrelationships of figures in different drawings are not necessarily shown exactly, and can be appropriately changed. Also, in the following description, similar components will be shown in the drawings while being denoted by the same reference signs, and names and functions thereof shall be similar. Thus, detailed description for such components will be occasionally omitted.

Also, while the following description will use terms which mean specific positions and directions such as "upper", "lower", "side", "bottom", "front", and "rear" in some portions, those terms are used for the sake of convenience in order to facilitate understanding of contents of the embodiments, and are not pertinent to directions for actual implementation.

First Embodiment

<Configuration>

FIG. 1 is a cross-sectional view showing a configuration of a semiconductor device related to the present embodiment.

As shown in FIG. 1, the semiconductor device includes an n-type silicon carbide (SiC) substrate 1, an n-type silicon carbide buffer layer 2, an n-type silicon carbide drift layer 3, a p-type termination region 7, a p-type first silicon carbide layer 4, a p-type second silicon carbide layer 5, a p-type third silicon carbide layer 6, an anode electrode 8, and a cathode electrode 9.

The silicon carbide buffer layer 2 is a layer which is epitaxially grown on the silicon carbide substrate 1. The silicon carbide buffer layer 2 is an n-type layer having a concentration which is higher than that of the silicon carbide substrate 1.

The silicon carbide drift layer 3 is a layer which is epitaxially grown on the silicon carbide buffer layer 2. The silicon carbide drift layer 3 is an n-type layer having a concentration which is lower than that of the silicon carbide substrate 1.

The termination region 7 is a region formed in a surface layer of the silicon carbide drift layer 3. The termination region 7 alleviates electric-field concentration which occurs in an end portion of the anode electrode 8.

The first silicon carbide layer 4 is a layer which is epitaxially grown in a region interposed between portions of the termination region 7 on the silicon carbide drift layer 3.

The second silicon carbide layer 5 is a layer which is epitaxially grown on the first silicon carbide layer 4. The second silicon carbide layer 5 is a p-type layer having a concentration which is lower than that of the first silicon carbide layer 4 and the third silicon carbide layer 6.

The third silicon carbide layer 6 is a layer which is epitaxially grown on the second silicon carbide layer 5. The third silicon carbide layer 6 forms a low ohmic contact with the anode electrode 8.

The cathode electrode 9 is an electrode formed in a rear surface of the silicon carbide substrate 1. The anode electrode 8 is an electrode formed on the third silicon carbide layer 6.

The semiconductor device related to the present embodiment includes a pn junction, and serves as a rectifier semiconductor in which a forward current flows when an anode side is set as a positive pole and a cathode side is set as a negative pole. The pn junction is formed by the silicon carbide drift layer 3 and the first silicon carbide layer 4, and inclusion of the pn junction allows the semiconductor device related to the present embodiment to operate as a bipolar device which has a negative temperature coefficient of resistance at a forward-current-carrying time. That is, resistance is reduced as a temperature rises, so that a current increases as a temperature rises under a condition that a voltage is constant.

The second silicon carbide layer 5 connected in series with the first silicon carbide layer 4 is not in contact with the n-type silicon carbide drift layer 3, the n-type silicon carbide buffer layer 2, and the n-type silicon carbide substrate 1, so that the second silicon carbide layer 5 does not operate as a bipolar device. Then, the second silicon carbide layer 5 functions as a resistor having resistance which increases as a temperature rises, in other words, a resistor having a positive temperature coefficient of resistance, during a forward-current-carrying time. As a result of this, a temperature coefficient of resistance provided when a forward current flows in the semiconductor device is positive.

<First Manufacturing Method>

FIGS. 2 to 5 are cross-sectional views showing respective states in processes for manufacturing the semiconductor device related to the present embodiment.

Figure 2:
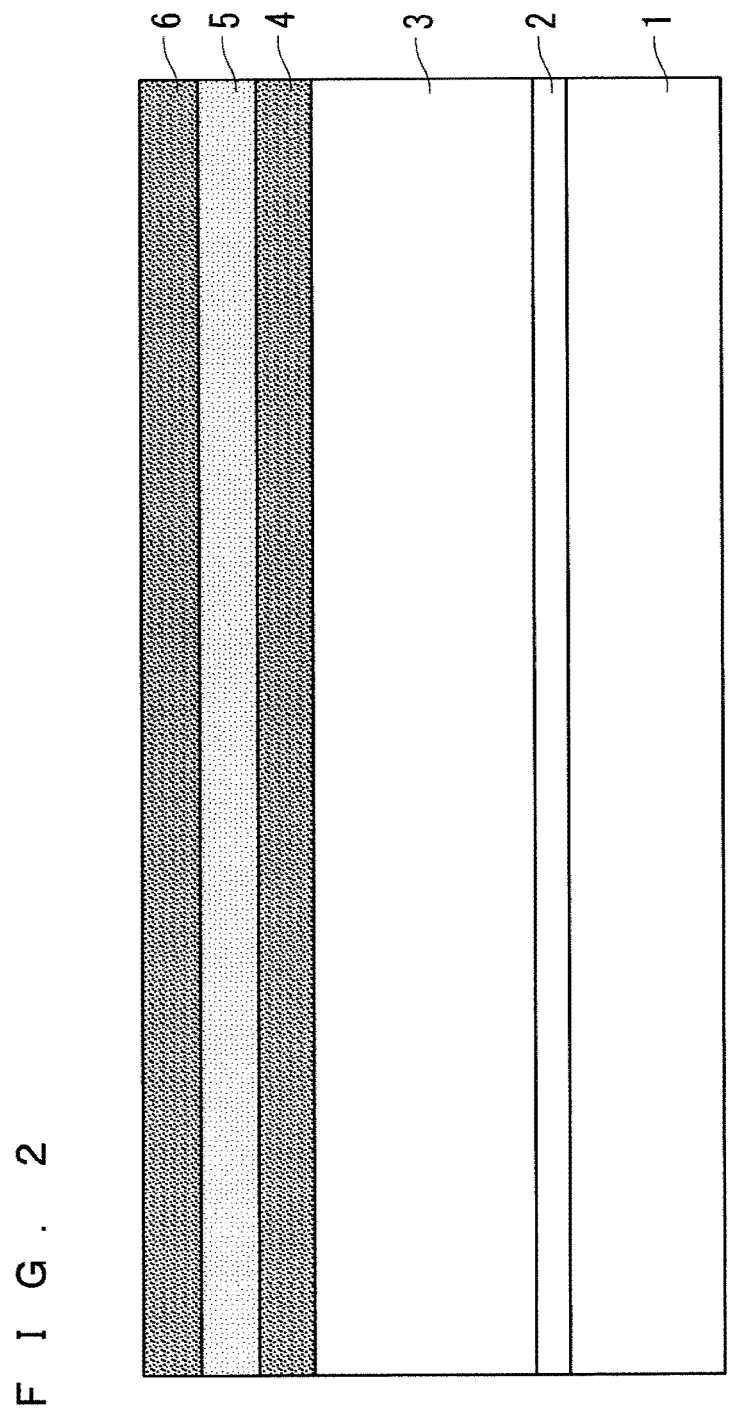
FIG. 2 is a cross-sectional view showing a state in each process for manufacturing the semiconductor device related to the embodiments.

First, as shown in FIG. 2, the n-type silicon carbide buffer layer 2, the n-type silicon carbide drift layer 3, the p-type first silicon carbide layer 4, the p-type second silicon carbide layer 5, and the p-type third silicon carbide layer 6 are sequentially formed on the silicon carbide substrate 1.

Figure 3:
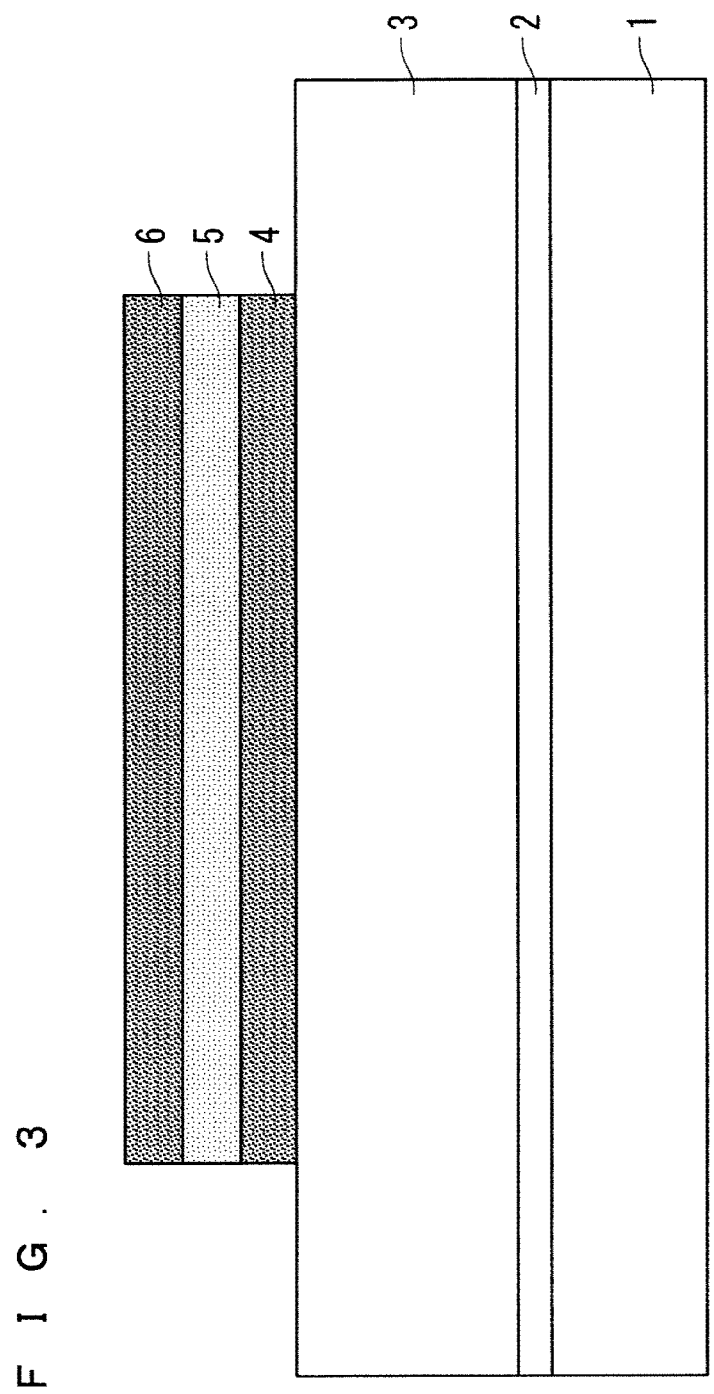
FIG. 3 is a cross-sectional view showing a state in each process for manufacturing the semiconductor device related to the embodiments.

Subsequently, as shown in FIG. 3, the first silicon carbide layer 4, the p-type second silicon carbide layer 5, and the p-type third silicon carbide layer 6 are partially removed by etching. Then, a front surface of the silicon carbide drift layer 3 is exposed.

Figure 4:
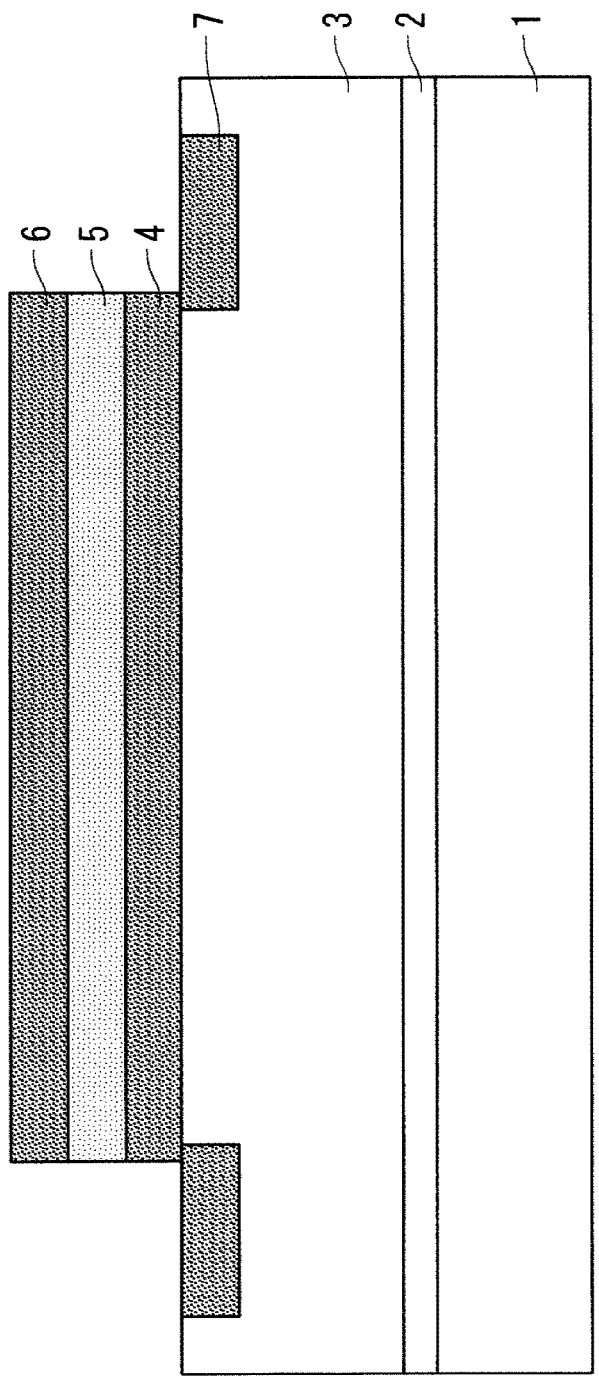
FIG. 4 is a cross-sectional view showing a state in each process for manufacturing the semiconductor device related to the embodiments.

Subsequently, as shown in FIG. 4, a p-type ion such as aluminum (Al), for example, is implanted into a surface layer of the exposed portion of the silicon carbide drift layer 3 at each of ends of the first silicon carbide layer 4, the p-type second silicon carbide layer 5, and the p-type third silicon carbide layer 6, so that the p-type termination region 7 is formed.

Figure 5:
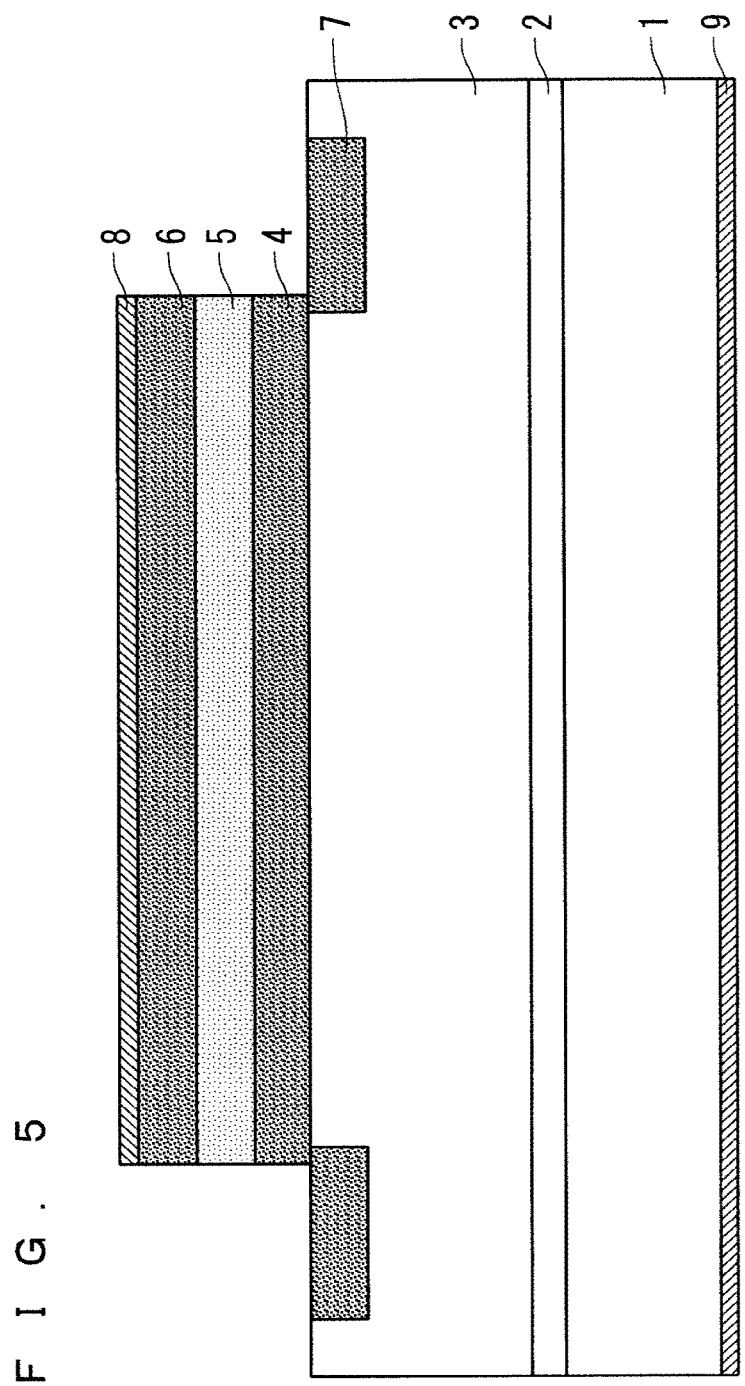
FIG. 5 is a cross-sectional view showing a state in each process for manufacturing the semiconductor device related to the embodiments.

Subsequently, as shown in FIG. 5, the anode electrode 8 is formed on the third silicon carbide layer 6. Also, the cathode electrode 9 is formed in a rear surface of the silicon carbide substrate 1. Formation of those electrodes is achieved in such a manner that carbon protective films formed respectively on the third silicon carbide layer 6 and a rear surface of the silicon carbide substrate 1 are subjected to heat treatment at a temperature of 1700° C. for ten minutes in order to activate a dopant, and thereafter are removed, for example.

<Second Manufacturing Method>

Next, another method for manufacturing the second silicon carbide layer 5 which serves as a resistor having a positive temperature coefficient will be described.

First, the n-type silicon carbide buffer layer 2, the n-type silicon carbide drift layer 3, the p-type first silicon carbide layer 4, the p-type second silicon carbide layer 5, and the p-type third silicon carbide layer 6 are sequentially formed on the silicon carbide substrate 1.

Subsequently, a p-type ion which uses aluminum (Al) or the like as a dopant is implanted from above the third silicon carbide layer 6. This can make a concentration of p-type impurities in the second silicon carbide layer 5, higher than that provided after film formation by epitaxial growth.

Subsequently, the first silicon carbide layer 4, the p-type second silicon carbide layer 5, and the p-type third silicon carbide layer 6 are partially removed by etching. Then, a front surface of the silicon carbide drift layer 3 is exposed.

Subsequently, a p-type ion such as aluminum (Al) for example, is implanted into a surface layer of the exposed portion of the silicon carbide drift layer 3 at each of ends of the first silicon carbide layer 4, the p-type second silicon carbide layer 5, and the p-type third silicon carbide layer 6, so that the p-type termination region 7 serving as a structure which alleviates electric-field concentration is formed.

Subsequently, the anode electrode 8 is formed on the third silicon carbide layer 6. Also, the cathode electrode 9 is formed in a rear surface of the silicon carbide substrate 1. Formation of those electrodes is achieved in such a manner that carbon protective films formed respectively on the third silicon carbide layer 6 and a rear surface of the silicon carbide substrate 1 are subjected to heat treatment at 1700° C. for ten minutes in order to activate a dopant, and thereafter are removed, for example.

The above-described manufacturing method allows a concentration of p-type impurities in the second silicon carbide layer 5 to be adjusted even after the third silicon carbide layer 6 is formed, so that a resistance value of the second silicon carbide layer 5 can be controlled with high accuracy.

<Profile of Impurity Concentration>

FIG. 6 is a view showing a profile of p-type and n-type impurity concentrations of silicon carbide layers arranged in a thickness direction from an anode electrode in the semiconductor device related to the present embodiment. When viewed from the anode electrode, the third silicon carbide layer 6 which forms an ohmic contact with the anode electrode, the second silicon carbide layer 5 which functions as a resistor having a positive temperature coefficient, the first silicon carbide layer 4, and the silicon carbide drift layer 3 are sequentially stacked.

Respective impurity concentrations and respective thicknesses of the layers are as follows. That is, the third silicon carbide layer 6 has a concentration of $1\times10^{19}$ p-type impurities/cm$^3$, and has a film thickness of 2000 nm. Also, the second silicon carbide layer 5 has a concentration of $1\times10^{13}$ p-type impurities/cm$^3$, and has a film thickness of 1000 nm. Also, the first silicon carbide layer 4 has a concentration of $1\times10^{18}$ p-type impurities/cm$^3$, and has a film thickness of 2000 nm. Also, the silicon carbide drift layer 3 has a concentration of $1\times10^{15}$ n-type impurities/cm$^3$, and has a film thickness of 60000 nm (not shown in the drawings).

Each of the layers is formed by epitaxial growth. The second silicon carbide layer 5 has a film thickness which is smaller than those of the other silicon carbide layers, and has an impurity concentration which is lower than those of the other silicon carbide layers. The second silicon carbide layer 5 has an impurity concentration which is the lowest among p-type silicon carbide layers, namely, the first silicon carbide layer 4, the second silicon carbide layer 5, and the third silicon carbide layer 6, and a profile of a p-type impurity concentration thereof includes a portion where a minimum value appears.

A p-type impurity concentration of the second silicon carbide layer 5 is adjusted by ion implantation using a p-type impurity (aluminum, for example) after film formation. Conditions for ion implantation are that an acceleration voltage is 700 keV and an irradiation dose is $1\times10^{13}$ ions/cm$^2$, for example.

As a result of ion implantation performed on the second silicon carbide layer 5 via the third silicon carbide layer 6, a p-type impurity concentration of a portion of the second silicon carbide layer 5, which is located on a region closer to the third silicon carbide layer 6, can be equal to $1\times10^{14}$ impurities/cm$^3$, for example, and a p-type impurity concentration of a portion on the opposite side, i.e., a region closer to the first silicon carbide layer 4, can be equal to $2\times10^{13}$ impurities/cm$^3$, for example (refer to dotted lines in FIG. 6). In this manner, a profile of an impurity concentration of the second silicon carbide layer 5 has an inclination at which a concentration decreases as a distance from the anode electrode increases, and an impurity concentration of the portion on a region closer to the first silicon carbide layer 4 has a minimum value.

As described above, by forming a low-concentration p-type silicon carbide layer which is interposed between high-concentration p-type silicon carbide layers, that is, the second silicon carbide layer 5, it is possible to include a resistor having a positive temperature coefficient of resistance at a forward-current-carrying time. Also, an impurity concentration is adjusted by ion implantation, so that the second silicon carbide layer 5 having a desired resistance value can be manufactured with high accuracy. Therefore, even in a case where a plurality of semiconductor devices are connected in parallel and are driven, current concentration is suppressed, so that a stable operation can be achieved.

<Effects>

Below, effects produced by the present embodiment will be illustratively described.

According to the present embodiment, the semiconductor device includes the silicon carbide drift layer 3 of a first conductivity type (n type), the first silicon carbide layer 4 of a second conductivity type (p type) which is formed on the silicon carbide drift layer 3, and the p-type second silicon carbide layer 5 formed on the first silicon carbide layer 4. Then, the second silicon carbide layer 5 has a positive temperature coefficient of resistance.

With the above-described configuration, resistance of the second silicon carbide layer 5 increases as a temperature rises in the semiconductor at a forward-current-carrying time, so that an increase of a current which flows in the semiconductor device under a condition that a voltage is constant, can be suppressed.

Regarding a semiconductor device having a negative temperature coefficient of resistance, in a case where a plurality of semiconductor devices are connected in parallel and are driven, a current concentrates because resistance of a semiconductor device having a relatively high temperature is reduced, and then the semiconductor device is broken down, in some cases. On the other hand, in a case where the semiconductor device related to the present embodiment, which has a positive temperature coefficient of resistance, is used, even if a temperature rises in one of a plurality of semiconductor devices, resistance increases in the one semiconductor device in which a temperature rises, so that current concentration on the one semiconductor device is alleviated, and a stable operation can be achieved.

In this regard, while an impurity concentration and a film thickness of the silicon carbide drift layer 3 and an impurity concentration and a film thickness of the first silicon carbide layer 4 vary depending on a required withstand voltage, it is preferable that the silicon carbide drift layer 3 has a concentration of $3\times10^{15}$ n-type impurities/cm$^3$ or lower and a film thickness of 25 μm or larger, in a semiconductor device having a withstand voltage of 3300 V or higher, for example. Also, it is preferable that the first silicon carbide layer 4 has a concentration of $1\times10^{17}$ p-type impurities/cm$^3$ or higher and a film thickness of 1 μm or larger.

The second silicon carbide layer 5 functions as a resistor having a positive temperature coefficient of resistance at a forward-current-carrying time. While also each of the silicon carbide substrate 1 and the third silicon carbide layer 6 makes a contribution as a resistor having a positive temperature coefficient of resistance at a forward-current-carrying time, a resistance value of the silicon carbide substrate 1, which is formed before film formation for the silicon carbide drift layer 3, is difficult to adjust after film formation for the silicon carbide drift layer 3. Also, while the third silicon carbide layer 6 is ordinarily required to have a film thickness of approximately 0.5 μm or larger and 2 μm or smaller because a high p-type impurity concentration ($1\times10^{18}$ impurities/cm$^3$, for example) is required in order to form a low ohmic contact with the anode electrode 8, the third silicon carbide layer 6 should have a film thickness of 100 μm or larger in a case where the third silicon carbide layer 6 is used as a resistor. In such the case as described, where a film thickness is large, a time for film formation increases, which allows easy mixture of a foreign substance during film formation, so that a proper device operation cannot be expected due to reduction in film quality in some instances.

In view of the foregoing matters, a resistor having a positive temperature coefficient of resistance is formed by reduction of a film thickness of the second silicon carbide layer 5, which allows a film quality to be maintained, and by reduction of an impurity concentration.

A resistance value of the second silicon carbide layer 5 is determined by a film thickness and a p-type impurity concentration. Also, a temperature coefficient of resistance is determined by temperature dependence of a carrier concentration and temperature dependence of mobility. As for silicon carbide, since temperature dependence of a carrier concentration acts in a negative direction of a temperature coefficient and temperature dependence of mobility acts in a positive direction of a temperature coefficient, it is possible to make a temperature coefficient of resistance positive by reducing a contribution of a carrier concentration to a temperature coefficient.

The same resistance value of the second silicon carbide layer 5 can be obtained in both of a case where a p-type impurity concentration is high and a film thickness is large, and a case where a p-type impurity concentration is low and a film thickness is small. However, if a thickness is extremely large or extremely small, the following problems may arise in some cases.

In a case where a film thickness of the second silicon carbide layer 5 is extremely large, a foreign substance can be more easily mixed into a film during film formation because of an increased time for film formation, so that a film quality is likely to be reduced. Thus, in order to enhance a film quality, it is desired that a film thickness of the second silicon carbide layer 5 is small, and is smaller than that of the silicon carbide drift layer 3 which has the largest film thickness among the epitaxially-grown silicon carbide layers. It is more preferable that a film thickness of the second silicon carbide layer 5 is one-tenth or smaller of a film thickness of the silicon carbide drift layer 3.

On the other hand, in order to achieve the same resistance value even in a case where a film thickness is extremely small, an impurity concentration should be reduced. However, for epitaxial growth, a certain quantity of impurities is present as background in a film forming apparatus, so that an impurity concentration has a lower limit. Thus, there is a limit to which a film thickness can be reduced.

As a consequence, a film thickness of the second silicon carbide layer 5 is approximately equal to or larger than 0.01 µm and is smaller than 25 µm, and preferably is equal to or larger than 0.01 µm and is equal to or smaller than 4 µm. A p-type impurity concentration of the second silicon carbide layer 5 is equal to or larger than $1 \times 10^{13}$ impurities/cm$^3$ and is equal to or smaller than $4 \times 10^{16}$ impurities/cm$^3$, and preferably is equal to or larger than $1 \times 10^{13}$ impurities/cm$^3$ and is equal to or smaller than $4 \times 10^{15}$ impurities/cm$^3$. A resistance value of the second silicon carbide layer 5 preferably is equal to or larger than 0.2 mΩcm$^2$ and is equal to or smaller than 2 mΩcm$^2$, as sheet resistance. As an example, conceivable is a case where the second silicon carbide layer 5 has a concentration of $1 \times 10^{15}$ p-type impurities/cm$^3$, a film thickness of 1.5 µm, and sheet resistance of 2 mΩcm$^2$, or a case where the second silicon carbide layer 5 has a concentration of $2 \times 10^{15}$ p-type impurities/cm$^3$, a film thickness of 0.3 µm, and sheet resistance of 0.2 mΩcm$^2$.

In the above-described manner, a temperature coefficient of resistance can be made positive in a rectifier semiconductor device including a pn junction.

Also, in a case where the second silicon carbide layer 5 is used as a positive resistor, occurrence of defect during film formation is suppressed because a film thickness thereof is smaller than that of the silicon carbide drift layer 3. Also, in a case where the second silicon carbide layer 5 is used as a positive resistor, occurrence of defect during film formation is suppressed because a film thickness thereof is smaller than that of the first silicon carbide layer 4.

Also, since the second silicon carbide layer 5 is formed after film formation for the silicon carbide drift layer 3, it is possible to adjust a resistance value thereof by forming a film after a p-type impurity concentration and a film thickness of the second silicon carbide layer 5 are set in accordance with a resistance value of the silicon carbide drift layer 3 and an operating temperature of the semiconductor device.

In a case where a silicon carbide layer having a positive temperature coefficient of resistance is formed on the silicon carbide substrate 1 before the silicon carbide drift layer 3 is formed, a temperature coefficient of resistance of the semiconductor device as a whole cannot be possibly set at a desired value if an impurity concentration and a film thickness of the silicon carbide drift layer 3 deviate from desired values due to manufacturing errors. Also, there are difficulties in adjusting a temperature coefficient of resistance of the semiconductor device as a whole.

However, in the present embodiment, since the second silicon carbide layer 5 is formed after film formation for the silicon carbide drift layer 3, it is possible to form a film while adjusting a p-type impurity concentration and a film thickness of the second silicon carbide layer 5 so that a temperature coefficient of resistance of the semiconductor device as a whole can have a desired value, by previously measuring an n-type impurity concentration and a film thickness of the silicon carbide drift layer 3. That is, a temperature coefficient of resistance of the semiconductor device as a whole can be adjusted with high accuracy.

Also, if a value of sheet resistance of the second silicon carbide layer 5 deviates from a desired value, it is possible to further adjust the value of sheet resistance by referring to a result of measurement of a p-type impurity concentration and a film thickness of the second silicon carbide layer 5 after film formation.

If sheet resistance is high, it is possible to reduce sheet resistance by polishing a front surface of the second silicon carbide layer 5 and reducing a film thickness. Also, if sheet resistance is low, t is possible to increase sheet resistance by additionally stacking a p-type silicon carbide layer on the second silicon carbide layer 5 and increasing a film thickness. A combination of the second silicon carbide layer 5 and the additionally-stacked p-type silicon carbide layer can be recognized as a resistor having a positive temperature coefficient. In other words, the second silicon carbide layer 5 may be a multilayered structure including a plurality of silicon carbide layers which are different in p-type impurity concentration.

Also, since the second silicon carbide layer 5 is formed after film formation for the silicon carbide drift layer 3, a conductivity type of an impurity in the second silicon carbide layer 5 serving as a resistor having a positive temperature coefficient is reverse to a conductivity type of an impurity in the silicon carbide drift layer 3. For example, in a case where the silicon carbide drift layer 3 is of an n type, an impurity in a resistor having a positive temperature coefficient is of a p type. On the other hand, in a case where the silicon carbide drift layer 3 is of a p type, an impurity in a resistor having a positive temperature coefficient is of an n type.

Also, in the present embodiment, the second silicon carbide layer 5 is placed so as to be interposed between high-concentration p-type silicon carbide layers, so that a minimum value of a p-type impurity concentration appears in a p-type silicon carbide layer formed on the silicon carbide drift layer 3. While a resistor having a positive temperature coefficient has a low impurity concentration and a small film thickness, the high-concentration first silicon carbide layer 4 is formed on a region closer to the silicon carbide drift layer 3, so that a depletion layer is prevented from expanding to the second silicon carbide layer 5 when a reverse voltage is applied. Therefore, a withstand voltage can be maintained. Also, since the high-concentration third silicon carbide layer 6 is foil led on a region closer to the anode electrode 8, contact resistance with the anode electrode 8 can be reduced.

Also, in a profile of a p-type impurity concentration of p-type silicon carbide layers including the second silicon carbide layer 5 formed on the silicon carbide drift layer 3, either a region where an impurity concentration gradually decreases as a distance from the anode electrode 8 increases, or a region where an impurity concentration gradually increases as a distance from the silicon carbide drift layer 3 decreases, may be formed.

It is noted that though the configuration in the other respects than described above can be appropriately omitted, the above-described effects can be produced even if arbitrary configurations described in the present specification are appropriately added.

Also, according to the present embodiment, the second silicon carbide layer has an impurity concentration which is lower than that of the first silicon carbide layer 4.

With the foregoing configuration, the second silicon carbide layer 5 can be formed so as to be thin, and a temperature coefficient of resistance can be made positive.

Also, according to the present embodiment, the third silicon carbide layer 6 of a second conductivity type which is formed on the second silicon carbide layer 5 is further included, and the third silicon carbide layer 6 has an impurity concentration which is higher than that of the second silicon carbide layer 5.

With the foregoing configuration, contact resistance with the anode electrode 8 can be reduced because the high-concentration third silicon carbide layer 6 is formed on a region closer to the anode electrode 8.

Also, according to the above-described embodiment, in the second silicon carbide layer 5, an impurity concentration of a region on a region closer to the first silicon carbide layer 4 is lower than an impurity concentration of a region on a region closer to the third silicon carbide layer 6.

With the foregoing configuration, the high-concentration first silicon carbide layer 4 is formed on a region closer to the silicon carbide drift layer 3, so that a depletion layer is prevented from expanding to the second silicon carbide layer 5 when a reverse voltage is applied. Therefore, a withstand voltage can be maintained. Also, since the high-concentration third silicon carbide layer 6 is formed on a region closer to the anode electrode 8, contact resistance with the anode electrode 8 can be reduced.

Also, according to the present embodiment, a thickness of the second silicon carbide layer 5 is one-tenth or smaller of a thickness of the silicon carbide drift layer 3.

With the foregoing configuration, occurrence of defect during film formation is suppressed because a film thickness is smaller than that of the silicon carbide drift layer 3.

Second Embodiment

<Configuration>

Below, components which are similar to those in the above-described embodiment will be shown in the drawings while being denoted by the same reference signs, and detailed description thereof will be appropriately omitted.

Figure 7:
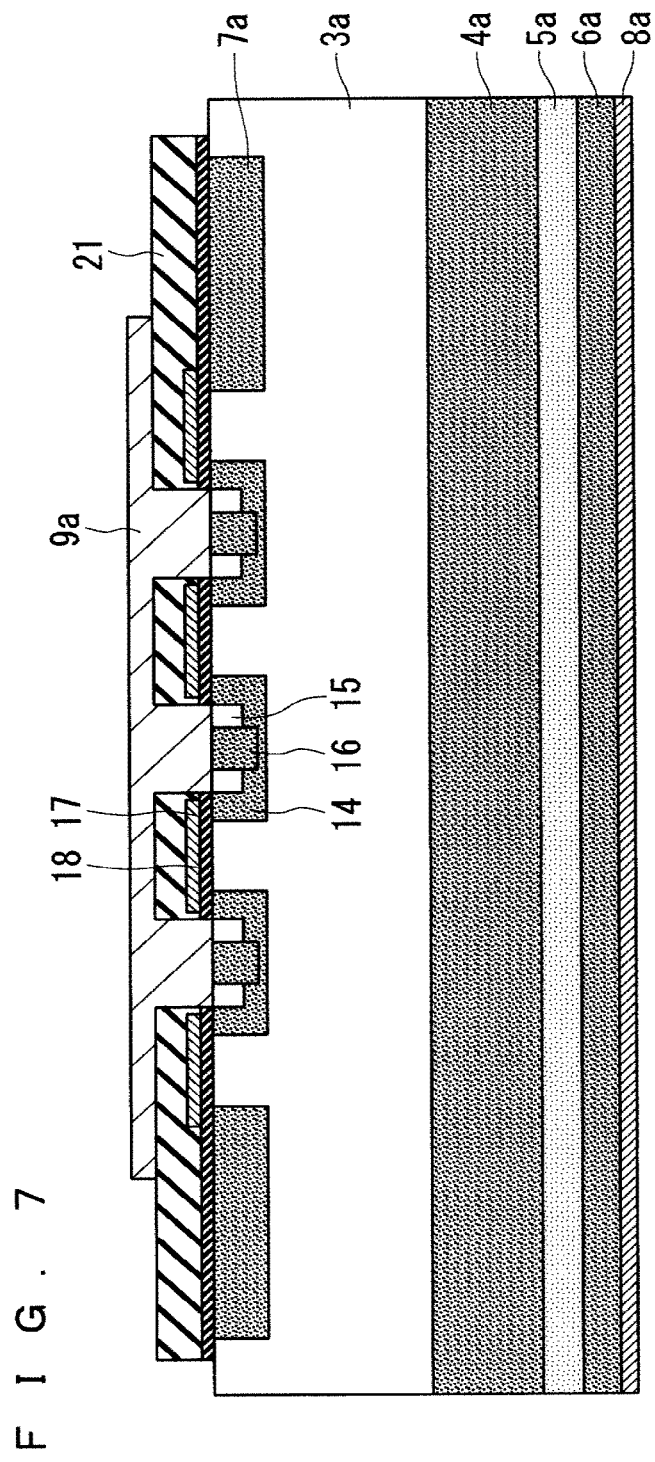
FIG. 7 is a cross-sectional view showing a configuration of a semiconductor device related to the embodiments.

FIG. 7 is a cross-sectional view showing a configuration of a semiconductor device related to the present embodiment. In the present embodiment, an insulated gate bipolar transistor (IGBT) including a silicon carbide layer is shown as an example.

As shown in FIG. 7, the semiconductor device includes a p-type third silicon carbide layer 6a, a p-type second silicon carbide layer 5a, a p-type first silicon carbide layer 4a, an n-type silicon carbide drift layer 3a, a p-type termination region 7a, p-type base regions 14, an n-type contact region 15, a p-type contact region 16, a gate electrode 17, a gate oxide film 18, an insulating film 21, an anode electrode 8a, and a cathode electrode 9a.

The first silicon carbide layer 4a is a layer which is epitaxially grown on a rear surface of the silicon carbide drift layer 3a.

The second silicon carbide layer 5a is a layer which is epitaxially grown on a rear surface of the first silicon carbide layer 4a. The second silicon carbide layer 5a is a p-type layer having a concentration which is lower than that of each of the first silicon carbide layer 4a and the third silicon carbide layer 6a.

The third silicon carbide layer 6a is a layer which is epitaxially grown on a rear surface of the second silicon carbide layer 5a. The third silicon carbide layer 6a forms a low ohmic contact with the anode electrode 8a.

The termination region 7a is a region formed in a surface layer of the silicon carbide drift layer 3a.

The base regions 14 are formed in plural numbers in a surface layer of the silicon carbide drift layer 3 while being separated from each other.

The contact region 15 is a region formed within each of the base regions 14. The contact region 15 forms a low ohmic contact with the cathode electrode 9a.

The contact region 16 is a region formed within each of the base regions 14.

The gate electrode 17 is an electrode formed via the gate oxide film 18 on a portion of each of the base regions 14, which is interposed between the contact region 15 and the silicon carbide drift layer 3a.

The insulating film 21 is a film formed so as to cover the gate electrode 17 and the termination region 7a.

The anode electrode 8a is an electrode formed on a rear surface of the third silicon carbide layer 6a. The cathode electrode 9a is an electrode formed so as to cover the insulating film 21, the contact region 15, and the contact region 16.

A pn junction is formed by the first silicon carbide layer 4a and the silicon carbide drift layer 3a, and inclusion of the pn junction allows the semiconductor device related to the present embodiment to operate as a bipolar transistor having a negative temperature coefficient of resistance at a forward-current-carrying time. Also, the semiconductor device related to the present embodiment, upon application of a gate electrode thereto, functions as a transistor which can control a current flowing across a surface of each of the base regions 14 below the gate electrode 17.

The second silicon carbide layer 5a connected in series with the first silicon carbide layer 4a functions as a resistor having a positive temperature coefficient of resistance at a forward-current-carrying time.

In the present embodiment, for a resistor having a positive temperature coefficient of resistance at a forward-current-carrying time, the second silicon carbide layer 5a which operates as a unipolar device is connected in series with the pn junction which performs a bipolar operation. Accordingly, when semiconductor devices each related to the present embodiment are connected in parallel and are caused to operate, current concentration on individual semiconductor devices can be prevented from occurring due to temperature rise, so that a stable operation can be achieved.

<First Manufacturing Method>

FIGS. 8 to 13 are cross-sectional view showing respective processes for manufacturing the semiconductor device related to the present embodiment.

Figure 8:
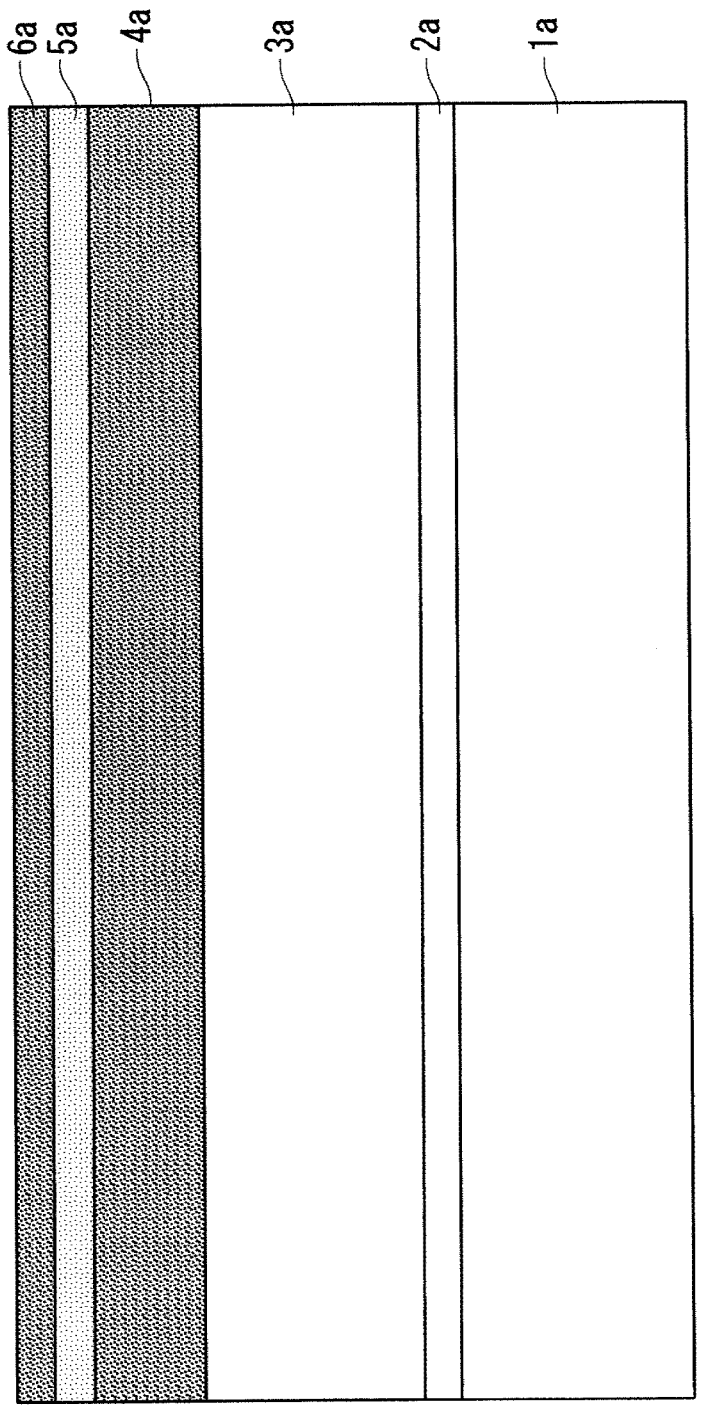
FIG. 8 is a cross-sectional view showing a state in each process for manufacturing the semiconductor device related to the embodiments.

First, as shown in FIG. 8, an n-type silicon carbide buffer layer 2a, the n-type silicon carbide drift layer 3a, the p-type first silicon carbide layer 4a, the p-type second silicon carbide layer 5a, and the p-type third silicon carbide layer 6a are sequentially formed on a silicon carbide substrate 1a.

In this regard, respective impurity concentrations and respective film thicknesses of the silicon carbide layers will be described. For example, the third silicon carbide layer 6a has a concentration of $1 \times 10^{19}$ p-type impurities/cm$^3$, and has a film thickness of 10000 nm. Also, the second silicon carbide layer 5a has a concentration of $1 \times 10^{13}$ p-type impurities/cm$^3$, and has a film thickness of 1000 nm. Also, the first silicon carbide layer 4a has a concentration of $1 \times 10^{18}$ p-type impurities/cm$^3$, and has a film thickness of 2000 nm. Also, the silicon carbide drift layer 3a has a concentration of $1 \times 10^{15}$ n-type impurities/cm$^3$, and has a film thickness of 60000 nm.

Figure 9:
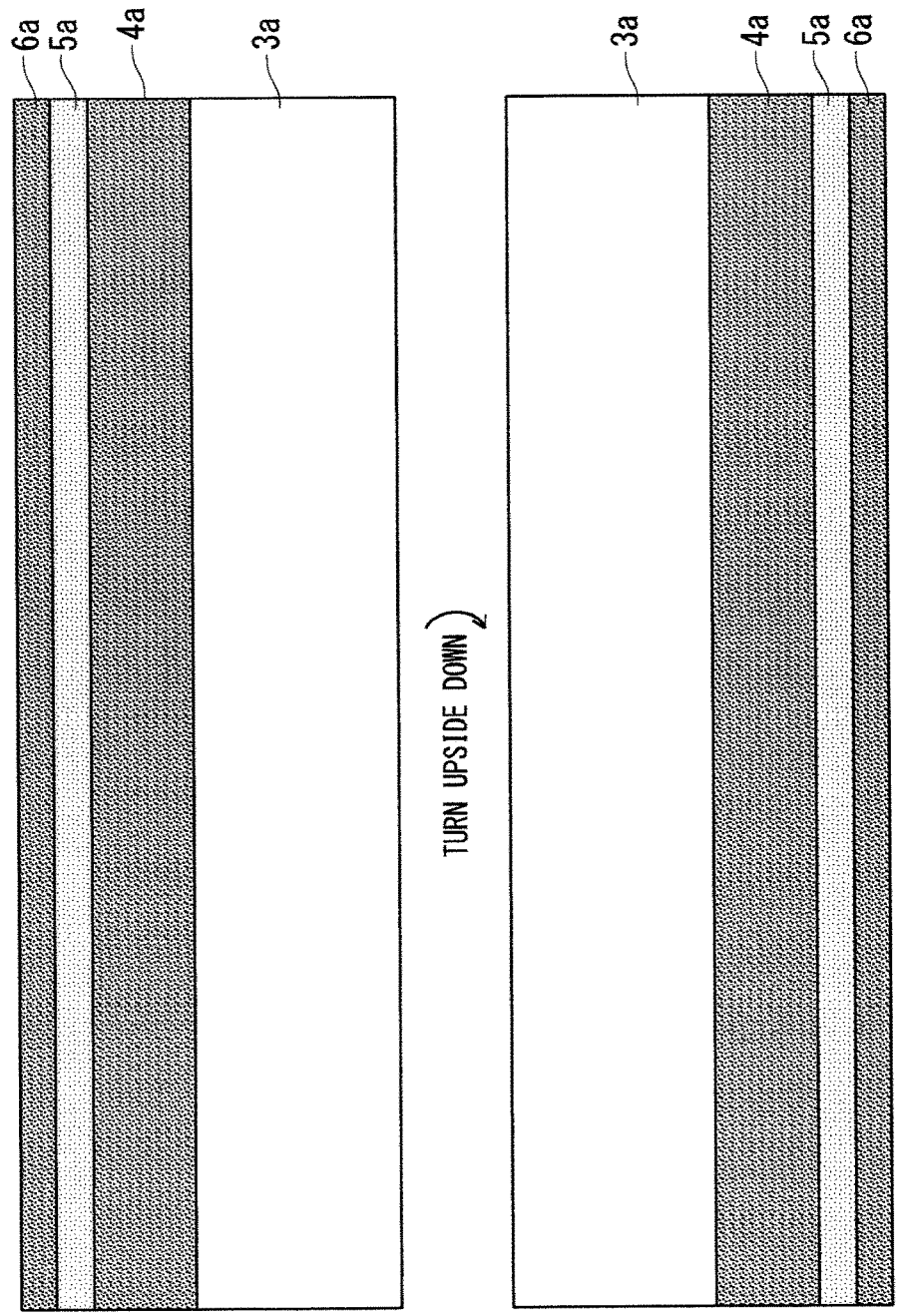
FIG. 9 is a cross-sectional view showing a state in each process for manufacturing the semiconductor device related to the embodiments.

Subsequently, as shown in FIG. 9, grinding is performed on a surface on a side where the silicon carbide substrate 1 is provided, in other words, a surface opposite to a surface where the third silicon carbide layer 6a is formed, and the silicon carbide substrate 1a and the silicon carbide buffer layer 2a are totally removed. In this manner, a layered structure including the third silicon carbide layer 6a, the second silicon carbide layer 5a, the first silicon carbide layer 4a, and the silicon carbide drift layer 3a is formed.

Thereafter, with the formed layered structure being turned upside down, a transistor is formed on a front surface of the silicon carbide drift layer 3a (refer to FIG. 9). The silicon carbide substrate 1a has crystal anisotropy, and the transistor is normally formed on either an Si surface or a C surface which has an off-angle.

Figure 10:
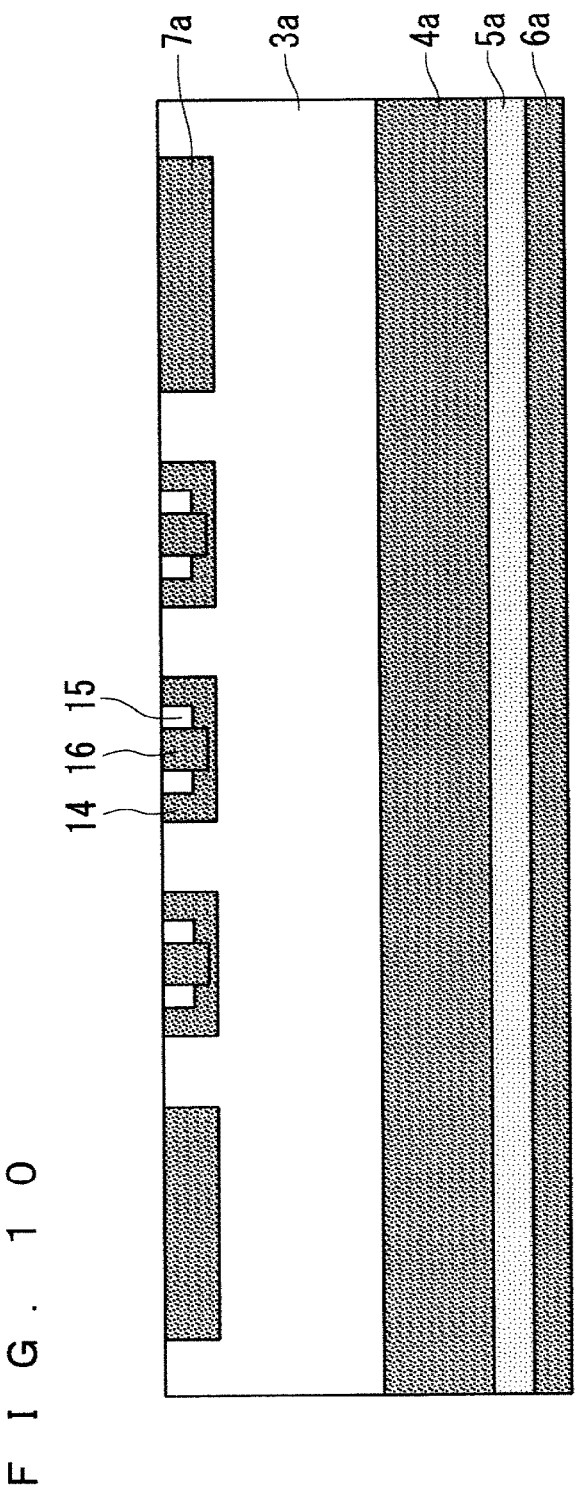
FIG. 10 is a cross-sectional view showing a state in each process for manufacturing the semiconductor device related to the embodiments.

Subsequently, as shown in FIG. 10, the base regions 14 which are separated from each other are formed in a front surface of the silicon carbide drift layer 3a. Then, the contact region 15 and the contact region 16 are formed within each of the base regions 14. The base regions 14 and the contact regions 16 are formed by p-type ion implantation which uses aluminum (Al) as a dopant. Conditions for aluminum (Al)-ion irradiation for the base regions 14 are that energy is 700 keV and an implantation dose is $7 \times 10^{13}$/cm$^2$, for example. Also, conditions for aluminum (Al)-ion irradiation for the contact regions 16 are that energy is 200 keV and an implantation dose is $1 \times 10^{15}$/cm$^2$, for example. The contact regions 15 are formed by n-type ion implantation which uses nitrogen (N) as a dopant. Conditions for nitrogen (N)-ion irradiation for the contact regions 15 are that energy is 120 keV and an implantation dose is $7 \times 10^{14}$/cm$^2$, for example.

Subsequently, a p-type ion using an aluminum (Al) ion is implanted onto a portion of the silicon carbide drift layer 3a, which corresponds to a perimeter of the device, so that the p-type termination region 7a serving as a structure which alleviates an electric field at an electrode end, is formed (refer to FIG. 10).

Subsequently, a carbon protective film is formed on upper surfaces of the silicon carbide drift layer 3a, the base regions 14, the contact regions 15, and the contact regions 16. Then, heat treatment is performed at a temperature of 1700° C. for ten minutes in order to activate a dopant.

Subsequently, after heat treatment, the carbon protective film is removed. Then, the gate electrode 17 is formed via the gate oxide film 18 on a portion of each of the base regions 14, which is interposed between the contact region 15 and the silicon carbide drift layer 3a. A front surface of each of the base regions 14, which is interposed between the contact region 15 and the silicon carbide drift layer 3a, is a channel region, and an amount of current flowing from the anode electrode 8a to the cathode electrode 9a is controlled by application of a gate electrode to the channel region.

Figure 11:
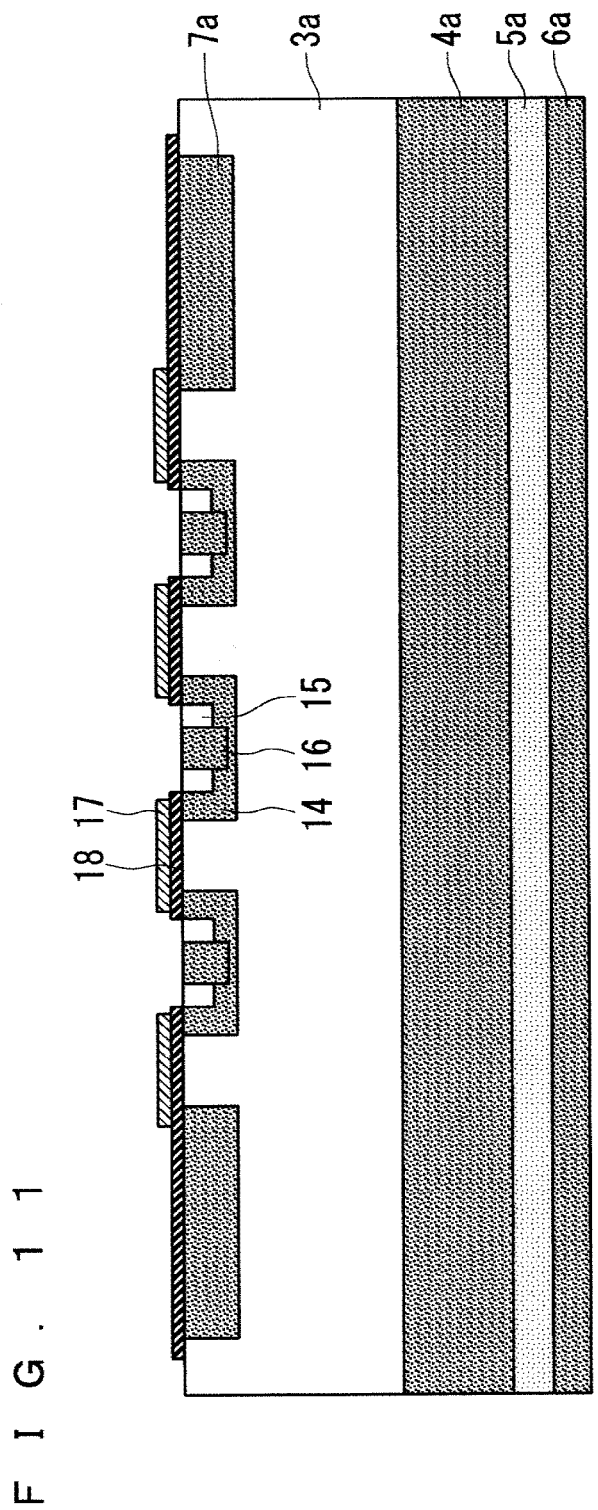
FIG. 11 is a cross-sectional view showing a state in each process for manufacturing the semiconductor device related to the embodiments.

As shown in FIG. 11, an opening which passes through the gate oxide film 18 and the gate electrode 17 is formed on the contact region 15 and the contact region 16.

Figure 12:
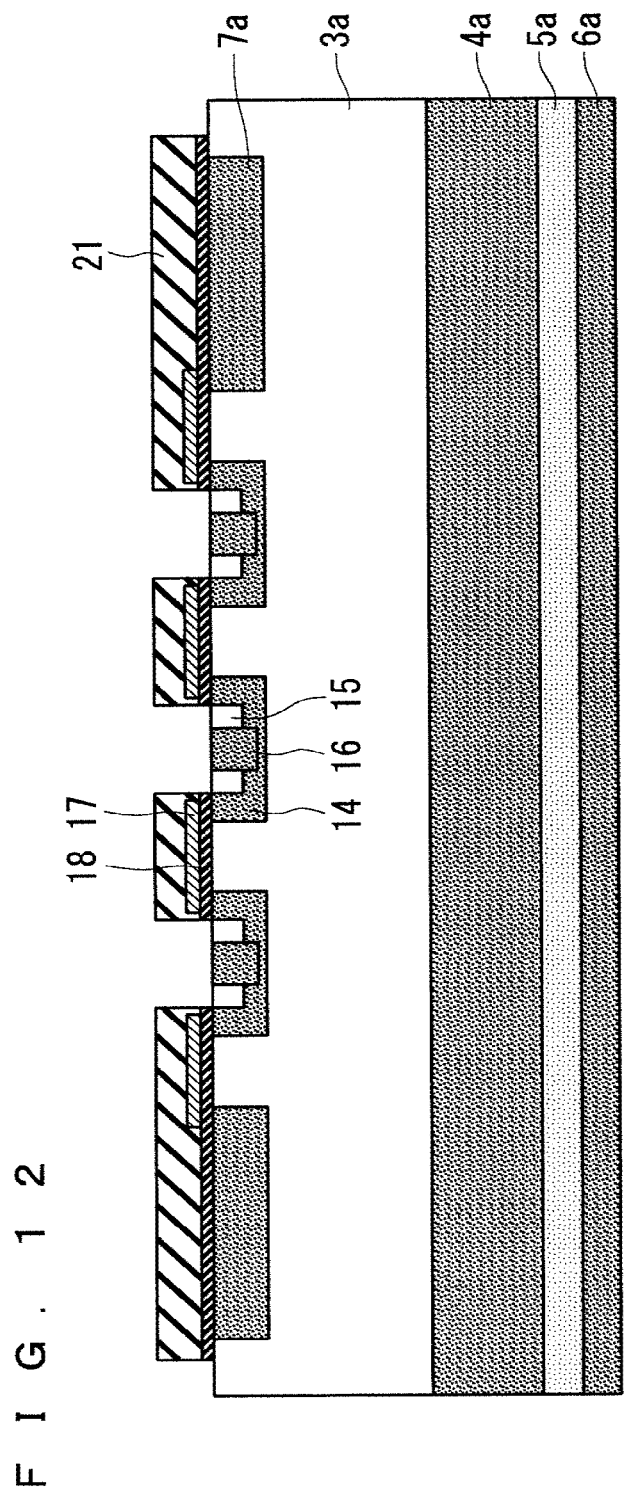
FIG. 12 is a cross-sectional view showing a state in each process for manufacturing the semiconductor device related to the embodiments.
Figure 13:
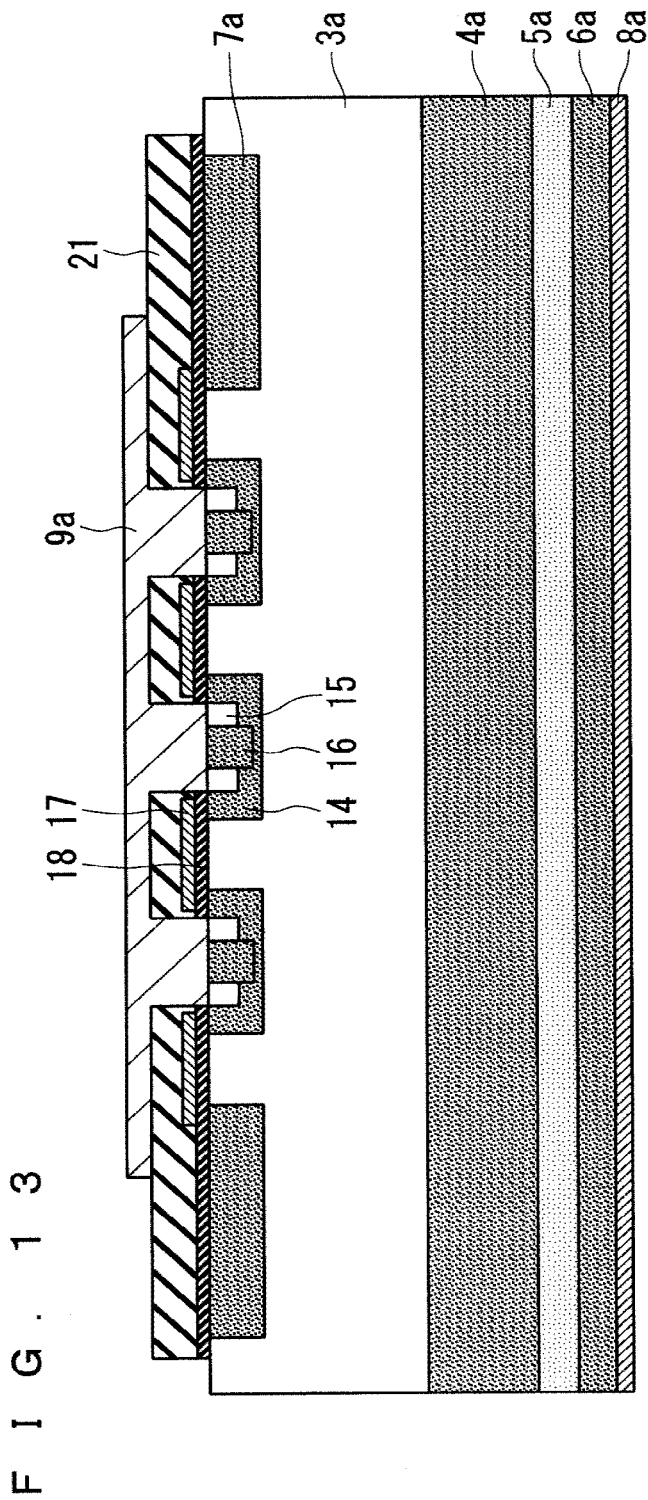
FIG. 13 is a cross-sectional view showing a state in each process for manufacturing the semiconductor device related to the embodiments.

Subsequently, as shown in FIG. 12, the insulating film 21 is formed on a front surface of the silicon carbide drift layer 3a, and thereafter, an opening which passes through the insulating film 21 is formed on the contact region 15 and the contact region 16. Further, as shown in FIG. 13, the cathode electrode 9a is formed in the opening on the contact region 15 and the contact region 16. Also, the anode electrode 8a is formed on a rear surface of the third silicon carbide layer 6a.

In the meantime, as for the second silicon carbide layer 5a which functions as a resistor having a positive temperature coefficient, a resistance value can be adjusted by ion implantation from a region where the anode electrode 8a is provided, after film formation. To adjust a resistance value by ion implantation, it is necessary to allow an ion to pass through the third silicon carbide layer 6a and reach the second silicon carbide layer 5a, and thus, a film thickness of the third silicon carbide layer 6a cannot be arbitrarily increased and is desired to be equal to or smaller than 5 μm, or preferably be equal to or smaller than 2 μm, after grinding of the silicon carbide substrate 1a.

In the present embodiment, resistance of a resistor can be adjusted after formation is achieved by epitaxial growth, and manufacturing variation in resistance value can be reduced. Also, since a resistor is formed after formation of the silicon carbide drift layer 3a, it is possible to adjust a resistance value, taking into account temperature characteristics of a bipolar device.

<Second Manufacturing Method>

While the third silicon carbide layer 6a, the second silicon carbide layer 5a, the first silicon carbide layer 4a, and the silicon carbide drift layer 3a are formed and stacked by epitaxial growth in the present embodiment, a different method for forming the second silicon carbide layer 5a will be described below.

A difference lies in that a p-type silicon carbide layer is epitaxially grown on the silicon carbide drift layer 3a, and thereafter, the first silicon carbide layer 4a, the second silicon carbide layer 5a, and the third silicon carbide layer 6a are formed within the above-stated silicon carbide layer by ion implantation.

More specific description will be provided as follows.

The silicon carbide buffer layer 2a, the silicon carbide drift layer 3a, and a p-type silicon carbide layer are formed and stacked by epitaxial growth on the silicon carbide substrate 1a. Then, the silicon carbide substrate 1a and the silicon carbide buffer layer 2a are grinded to be removed, and thereafter, n-type ion implantation which uses an nitrogen (N) ion is performed (ion irradiation conditions are that energy is 350 keV and an implantation dose is $5 \times 10^{14}$ ions/cm$^2$, for example) on a surface of the p-type silicon carbide layer, which is located opposite to the silicon carbide substrate 1a.

As a result of this, a concentration of p-type impurities in the p-type silicon carbide layer has an impurity-concentration profile in which a p-type impurity concentration decreases from a front surface of the concerned p-type silicon carbide layer toward a region closer to the silicon carbide drift layer 3a, has a minimum value, and thereafter becomes approximately equal to a p-type impurity concentration of a front surface of the concerned p-type silicon carbide layer in a deeper portion thereof which is much closer to the silicon carbide drift layer 3a. That is, a p-type silicon carbide layer having a low concentration which includes a minimum value of p-type impurity concentration is formed in the concerned p-type silicon carbide layer. In other words, provided is a state where a low-concentration p-type silicon carbide layer is formed so as to be interposed between high-concentration p-type silicon carbide layers, or more specifically, a state where the second silicon carbide layer 5a is formed on the first silicon carbide layer 4a and further the third silicon carbide layer 6a is formed on the second silicon carbide layer 5a.

Also the second silicon carbide layer 5a formed in the above-described manner functions as a resistor having a positive temperature coefficient of resistance at a forward-current-carrying time.

Also, by adjusting ion irradiation conditions, it is possible to form only the first silicon carbide layer 4a and the second silicon carbide layer 5a in a p-type silicon carbide layer.

Further, it is possible to form only the first silicon carbide layer 4a and the second silicon carbide layer 5a in a p-type silicon carbide layer also by p-type ion implantation. More specifically, by implanting a p-type ion under irradiation conditions which allow a layer which shall become the first silicon carbide layer 4a to include a peak, it is possible to achieve a state where the second silicon carbide layer 5a is formed on the first silicon carbide layer 4a.

By the manufacturing method according to the present embodiment, the second silicon carbide layer 5a can be formed by ion implantation. As a result of this, the second silicon carbide layer 5a having a resistance value which is set suitably in accordance with a concentration and a film thickness of the silicon carbide drift layer 3a, can be formed, so that a resistance value of a resistor having a positive temperature coefficient can be controlled with high accuracy.

<Effects>

Below, effects produced by the present embodiment will be described.

According to the present embodiment, in the method for manufacturing a semiconductor device, the silicon carbide drift layer 3a of a first conductivity type (n type) is formed, a silicon carbide layer of a second conductivity type (p type) is formed on the silicon carbide drift layer 3a, and further, a p-type ion is implanted into the p-type silicon carbide layer, so that a layer in a portion of the p-type silicon carbide layer, which is located on a region closer to the silicon carbide drift layer 3a, and a layer in a portion of the p-type silicon carbide layer, which is located on a region opposite to the silicon carbide drift layer 3a, are formed as the first silicon carbide layer 4a and the second silicon carbide layer 5a, respectively. Then, the second silicon carbide layer 5a has a positive temperature coefficient of resistance.

With the above-described configuration, the second silicon carbide layer 5a can be formed by p-type ion implantation, so that an impurity concentration of the second silicon carbide layer 5a can be adjusted suitably in accordance with a desired resistance value.

Also, according to the present embodiment, in the method for manufacturing a semiconductor device, the n-type silicon carbide drift layer 3a is formed, a p-type silicon carbide layer is formed on the silicon carbide drift layer 3a, and further, an n-type ion is implanted into the p-type silicon carbide layer, so that a layer in a portion of the p-type silicon carbide layer, which is located on a region closer to the silicon carbide drift layer 3a, and a layer in a portion of the p-type silicon carbide layer, which is located on a region opposite to the silicon carbide drift layer 3a, are formed as the first silicon carbide layer 4a and the second silicon carbide layer 5a, respectively. Then, the second silicon carbide layer 5a has a positive temperature coefficient of resistance.

With the above-described configuration, the second silicon carbide layer 5a can be formed by n-type ion implantation, so that an impurity concentration of the second silicon carbide layer 5a can be adjusted suitably in accordance with a desired resistance value.

Also, a low-concentration p-type silicon carbide layer can be formed within a high-concentration p-type silicon carbide layer by n-type ion implantation, without a need of epitaxial growth of a low-concentration p-type silicon carbide layer.

MODIFICATIONS

While properties, materials, dimensions, shapes, positional interrelationships, conditions for implementation, or the like of respective components have been described in some portions in the above-described embodiments, those are mere examples in all aspects, and those described in this specification impose no limitation. Accordingly, numerous modifications which are not illustratively described are conceivable within the scope of the present techniques. For example, there are included a case where an arbitrary component is transformed, is added, or is omitted, and further a case where at least one component in at least one embodiment is extracted and is combined with a component in another embodiment.

Also, unless contradiction arises, a component which has been described as being "one" in each of the above-described embodiments may be "more than one" component. Further, each of components is a conceptual unit, and there are included a case where one component includes a plurality of structures, and a case where one component corresponds to a part of a certain structure. Also, each of components can include a structure having a different configuration or a different shape so far as the same function is exhibited.

Also, description in the present specification should be referred to for all objects of the present techniques, and no portion therein acknowledges being conventional arts.

REFERENCE SIGNS LIST 1, 1a: silicon carbide substrate, 2, 2a: silicon carbide buffer layer, 3, 3a: silicon carbide drift layer: 4, 4a: first silicon carbide layer: 5, 5a: second silicon carbide layer, 6, 6a: third silicon carbide layer, 7, 7a: termination region: 8, 8a: anode electrode, 9, 9a: cathode electrode, 14: base region, 15, 16: contact region, 17: gate electrode, 18: gate oxide film, 21: insulating film

The invention claimed is:

1. A semiconductor device which is a bipolar device in which a current flows through a pn junction, comprising:
 a silicon carbide drift layer of a first conductivity type;
 a first silicon carbide layer of a second conductivity type which is formed on said silicon carbide drift layer;
 a second silicon carbide layer of the second conductivity type which is formed on said first silicon carbide layer; and
 a third silicon carbide layer of the second conductivity type which is formed on said second silicon carbide layer, wherein said second silicon carbide layer has a positive temperature coefficient of resistance,
said second silicon carbide layer has an impurity concentration which is lower than that of said first silicon carbide layer,
said third silicon carbide layer has an impurity concentration which is higher than that of said second silicon carbide layer, and
in said second silicon carbide layer, an impurity concentration of a region located on a side closer to said first silicon carbide layer is lower than that of a region located on a side closer to said third silicon carbide layer.

2. The semiconductor device according to claim 1, wherein
a thickness of said second silicon carbide layer is equal to or larger than 0.01 μm, and is equal to or smaller than 4 μm.

3. The semiconductor device according to claim 1, wherein
a concentration of impurities of the second conductivity type in said second silicon carbide layer is equal to or larger than $1\times10^{13}$ impurities/cm$^3$ and is equal to or smaller than $4\times10^{16}$ impurities/cm$^3$.

4. The semiconductor device according to claim 3, wherein
the concentration of the impurities of the second conductivity type in said second silicon carbide layer is equal to or smaller than $4\times10^{15}$ impurities/cm$^3$.

5. The semiconductor device according to claim 1, wherein
a thickness of said second silicon carbide layer is one-tenth or smaller of a thickness of said silicon carbide drift layer.

* * * * *